United States Patent
Thieu et al.

(10) Patent No.: US 12,230,500 B2
(45) Date of Patent: Feb. 18, 2025

(54) METHOD OF MANUFACTURING A BETA-Ga$_2$O$_3$-BASED SINGLE CRYSTAL FILM BY FLOWING A Ga CHLORIDE GAS, AN OXYGEN GAS, AND A DOPANT GAS

(71) Applicants: TAMURA CORPORATION, Tokyo (JP); Novel Crystal Technology, Inc., Saitama (JP)

(72) Inventors: Quang Tu Thieu, Sayama (JP); Kohei Sasaki, Sayama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 2 days.

(21) Appl. No.: 17/917,721

(22) PCT Filed: Apr. 7, 2021

(86) PCT No.: PCT/JP2021/014834
§ 371 (c)(1),
(2) Date: Oct. 7, 2022

(87) PCT Pub. No.: WO2021/210476
PCT Pub. Date: Oct. 21, 2021

(65) Prior Publication Data
US 2023/0162978 A1  May 25, 2023

(30) Foreign Application Priority Data
Apr. 14, 2020 (JP) .................. 2020-072460

(51) Int. Cl.
C30B 25/14 (2006.01)
C30B 25/20 (2006.01)
(Continued)

(52) U.S. Cl.
CPC .......... *H01L 21/0262* (2013.01); *C30B 25/14* (2013.01); *C30B 25/20* (2013.01);
(Continued)

(58) Field of Classification Search
CPC .......... C30B 25/00; C30B 25/02; C30B 25/14; C30B 25/16; C30B 25/165; C30B 25/18;
(Continued)

(56) References Cited

U.S. PATENT DOCUMENTS 9,926,646 B2   3/2018   Watanabe et al.
10,538,862 B2  1/2020   Goto et al.
(Continued)

FOREIGN PATENT DOCUMENTS

JP    2014094839 A   5/2014
JP    5984069 B2     9/2016
(Continued)

OTHER PUBLICATIONS

Translation of International Report on Patentability and Written Opinion dated Oct. 27, 2022 issued in PCT/JP2021/014834.
(Continued)

*Primary Examiner* — Kenneth A Bratland, Jr.
(74) *Attorney, Agent, or Firm* — Scully, Scott, Murphy & Presser, PC

(57) ABSTRACT

A method for manufacturing a semiconductor film includes placing a semiconductor substrate including a β-Ga$_2$O$_3$-based single crystal in a reaction chamber of an HVPE apparatus. When the semiconductor substrate is placed so that the growth base surface faces upward, an inlet for a dopant-including gas into the space is positioned higher than an inlet for an oxygen-including gas into the space and an inlet for a Ga chloride gas into the space is positioned higher than the inlet for the dopant-including gas into the space. When the semiconductor substrate is placed so that the
(Continued)

growth base surface faces downward, the inlet for the dopant-including gas into the space is positioned higher than the inlet for the Ga chloride gas into the space and the inlet for the oxygen-including gas into the space is positioned higher than the inlet for the dopant-including gas into the space.

3 Claims, 10 Drawing Sheets

(51) Int. Cl.
    *C30B 29/16*         (2006.01)
    *H01L 21/02*         (2006.01)
    *H01L 29/24*         (2006.01)
    *H01L 29/872*        (2006.01)

(52) U.S. Cl.
    CPC ........ *C30B 29/16* (2013.01); *H01L 21/02414* (2013.01); *H01L 21/02565* (2013.01); *H01L 21/02576* (2013.01); *H01L 21/02598* (2013.01); *H01L 21/02634* (2013.01); *H01L 29/24* (2013.01); *H01L 29/872* (2013.01)

(58) Field of Classification Search
    CPC ......... C30B 25/20; C30B 29/00; C30B 29/10; C30B 29/16; H01L 21/0262; H01L 21/02414; H01L 21/02565; H01L 21/02576; H01L 21/02598; H01L 21/02634; H01L 29/24; H01L 29/872; C23C 16/22; C23C 16/40; C23C 16/44; C23C 16/448; C23C 16/455; C23C 16/45561; C23C 16/45582; C23C 16/458
    USPC ............. 117/84, 88, 101–102, 105, 937, 944
    See application file for complete search history.

(56) References Cited

U.S. PATENT DOCUMENTS

| | | |
|---|---|---|
| 10,858,758 B2 | 12/2020 | Ohno |
| 11,047,067 B2 | 6/2021 | Goto et al. |
| 2015/0308012 A1 | 10/2015 | Watanabe et al. |
| 2016/0265137 A1 | 9/2016 | Goto et al. |
| 2018/0073164 A1* | 3/2018 | Goto ................. C30B 29/16 |
| 2019/0057866 A1* | 2/2019 | Oshima ............. C30B 29/16 |
| 2020/0017991 A1 | 1/2020 | Ohno |
| 2020/0102667 A1 | 4/2020 | Goto et al. |
| 2021/0404086 A1 | 12/2021 | Goto et al. |

FOREIGN PATENT DOCUMENTS

| | | |
|---|---|---|
| JP | 2016175807 A | 10/2016 |
| JP | 2019163200 A | 9/2019 |
| WO | 2018185850 A1 | 10/2018 |

OTHER PUBLICATIONS

International Search Report dated Jul. 6, 2021 issued in PCT/JP2021/014834.

\* cited by examiner

METHOD OF MANUFACTURING A BETA-Ga$_2$O$_3$-BASED SINGLE CRYSTAL FILM BY FLOWING A Ga CHLORIDE GAS, AN OXYGEN GAS, AND A DOPANT GAS

TECHNICAL FIELD

The present invention relates to a semiconductor film and a method for manufacturing the same.

BACKGROUND ART

A technique for growing a β-Ga$_2$O$_3$-based single crystal film by the HVPE (Halide Vapor Phase Epitaxy) method is known (see, e.g., Patent Literature 1). In the technique described in Patent Literature 1, a β-Ga$_2$O$_3$-based single crystal film is epitaxially grown on a Ga$_2$O$_3$-based substrate by flowing a gallium source gas, an oxygen source gas, and a dopant source gas into a region of a reaction chamber of a vapor phase growth apparatus in which the Ga$_2$O$_3$-based substrate is placed.

CITATION LIST

Patent Literatures

Patent Literature 1: Japanese Patent No. 5984069

SUMMARY OF INVENTION

Technical Problem

In growing a β-Ga$_2$O$_3$-based single crystal film by the HVPE method, however, a problem may arise that killer defects, which are critical defects causing significant degradation in device characteristics, are more likely to occur than in growing a single crystal film of another nitride semiconductor such as GaN by the HVPE method, and the causes of killer defects and methods for reducing killer defects have not been disclosed in the known techniques.

Thus, it is an object of the invention to provide a semiconductor film formed of a β-Ga$_2$O$_3$-based single crystal with few killer defects, and a method for manufacturing the semiconductor film.

Solution to Problem

To achieve the object, an aspect of the present invention provides a method for manufacturing a semiconductor film defined in (1) to (4) below, and a semiconductor film defined in (5) below.

(1) A method for manufacturing a semiconductor film, comprising:
  placing a semiconductor substrate comprising a β-Ga$_2$O$_3$-based single crystal in a reaction chamber of an HVPE apparatus so that a growth base surface of the semiconductor substrate faces upward or downward; and
  epitaxially growing a semiconductor film comprising a β-Ga$_2$O$_3$-based single crystal on the growth base surface of the semiconductor substrate by flowing a Ga chloride gas, an oxygen-including gas and a dopant-including gas into a space in the reaction chamber where the semiconductor substrate is placed,
  wherein when the semiconductor substrate is placed so that the growth base surface faces upward, an inlet for the dopant-including gas into the space is positioned higher than an inlet for the oxygen-including gas into the space and an inlet for the Ga chloride gas into the space is positioned higher than the inlet for the dopant-including gas into the space, and
  wherein when the semiconductor substrate is placed so that the growth base surface faces downward, the inlet for the dopant-including gas into the space is positioned higher than the inlet for the Ga chloride gas into the space and the inlet for the oxygen-including gas into the space is positioned higher than the inlet for the dopant-including gas into the space.

(2) The method for manufacturing a semiconductor film defined in (1), wherein the Ga chloride gas comprises a GaCl gas, wherein the oxygen-including gas comprises an O$_2$ gas, and wherein the dopant-including gas comprises a SiCl$_4$ gas.

(3) The method for manufacturing a semiconductor film defined in (1) or (2), wherein in the placing the semiconductor substrate, the semiconductor substrate is placed in the reactor chamber so that the growth base surface faces downward.

(4) The method for manufacturing a semiconductor film defined in (3), wherein in the epitaxially growing the semiconductor film, the Ga chloride gas, the oxygen-including gas and the dopant-including gas are flowed into the space at a flow velocity of not less than 110 cm/s.

(5) A semiconductor film, comprising:
  a β-Ga$_2$O$_3$-based single crystal comprising Cl,
  wherein an in-plane density of defects continuing from a front surface to a back surface in a thickness direction is not more than 10 defects/cm$^2$.

Advantageous Effects of Invention

According to the invention, it is possible to provide a semiconductor film formed of a β-Ga$_2$O$_3$-based single crystal with few killer defects, and a method for manufacturing the semiconductor film.

DESCRIPTION OF EMBODIMENTS

Figure 1:
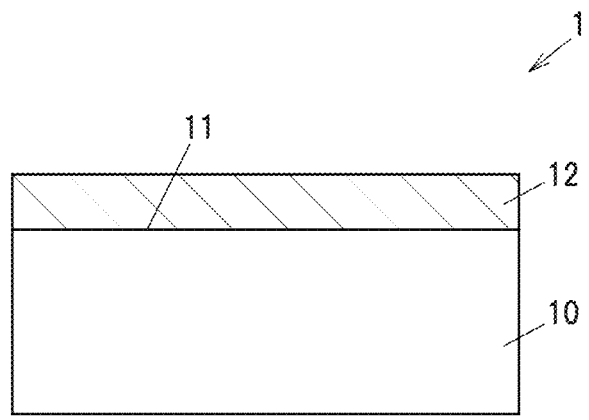
FIG. 1 is a vertical cross-sectional view showing a crystal laminated structure in the first embodiment of the present invention.

To investigate the cause of killer defects generated in $\beta$-Ga$_2$O$_3$-based single crystal films grown by the HVPE method, the present inventors made plural Schottky barrier diodes of different element sizes which have a $\beta$-Ga$_2$O$_3$ single crystal film grown by a known common method using the HVPE method, and then evaluated their reverse breakdown voltage characteristics.

The result was as follows: elements having near-ideal characteristics with suppressed reverse leakage current were obtained with a yield of about 80% when the element size (the size of the circular anode electrode) was not more than 400 μm in diameter, but the number of elements with large reverse leakage current increased as the element size increased, and the yield of elements with a diameter of 1 mm was substantially 0%.

From the fact that the element characteristics depend on the element size as described above, it was presumed that killer defects were present in crystal films. In addition, from the yield and the anode electrode area, it was estimated that the density of killer defects in the $\beta$-Ga$_2$O$_3$ crystal film grown by the known method was about 200 defects/cm$^2$. The killer defect density directly affected the manufacturable element size, i.e., the maximum current rating of devices, and the $\beta$-Ga$_2$O$_3$ crystal film made by the known method allowed to manufacture only Schottky barrier diodes with a rated current (a current value when a forward voltage of about 1.5 to 2.5 V is applied) of not more than 1A.

Then, as a result of intensive study, the inventors found that the main cause of killer defects in $\beta$-Ga$_2$O$_3$-based crystal films is grains of Ga oxide formed in a vapor phase in a reaction chamber of an HVPE apparatus. In growth of $\beta$-Ga$_2$O$_3$-based single crystal films by the HVPE method, the reaction rate of oxygen with Ga chloride gas is so fast that the reaction occurs in the vapor phase and grains of Ga oxide are formed and deposited on Ga$_2$O$_3$-based substrate. The grains of Ga oxide, when incorporated into an epitaxially growing $\beta$-Ga$_2$O$_3$-based single crystal film, causes disturbance of crystal periodicity, resulting in occurrence of many killer defects that continues from a front surface to a back surface in a thickness direction of the film and could act as leakage paths.

Meanwhile, it has been confirmed that generation of many killer defects as in the case of growing $\beta$-Ga$_2$O$_3$-based crystal films does not occur when growing GaN-based crystal films by the HVPE method. It is considered that this is because the reaction rate of ammonia gas with Ga chloride gas is relatively slow and formation of grains of GaN-based compound in the vapor phase hardly occur.

This invention relates to a method for manufacturing a semiconductor film formed of a $\beta$-Ga$_2$O$_3$-based single crystal, which can reduce the amount of Ga oxide grains formed in a vapor phase and deposited on a Ga$_2$O$_3$-based substrate in a reaction chamber of an HVPE apparatus and reduce killer defects, and a semiconductor film which is manufactured by the manufacturing method, is formed of a $\beta$-Ga$_2$O$_3$-based single crystal and includes few killer defects.

First Embodiment (Configuration of a Crystal Laminated Structure)

FIG. 1 is a vertical cross-sectional view showing a crystal laminated structure 1 in the first embodiment of the invention. The crystal laminated structure 1 has a semiconductor substrate 10 formed of a $\beta$-Ga$_2$O$_3$-based single crystal, and a semiconductor film 12 formed of a $\beta$-Ga$_2$O$_3$-based single crystal and epitaxially grown on a growth base surface 11 of the semiconductor substrate 10.

The $\beta$-Ga$_2$O$_3$-based single crystal here is a $\beta$-Ga$_2$O$_3$ single crystal which is a Ga$_2$O$_3$ single crystal having a $\beta$-crystal structure, or a $\beta$-Ga$_2$O$_3$ single crystal doped with elements such as Al and In, and may be, e.g., a (Ga$_x$Al$_y$In$_{(1-x-y)}$)$_2$O$_3$ ($0<x\leq1$, $0\leq y\leq1$, $0<x+y\leq1$) single crystal which is a $\beta$-Ga$_2$O$_3$ single crystal doped with Al and In. The band gap is widened by adding Al and is narrowed by adding In. The semiconductor substrate 10 may also include a dopant such as Si.

A plane orientation of the growth base surface 11 of the semiconductor substrate 10 is, e.g., (001), (010), (100), (011), (−201), or (101).

To form the semiconductor substrate 10, e.g., a bulk crystal of a Ga$_2$O$_3$-based single crystal grown by a melt-growth technique such as the FZ (Floating Zone) method or the EFG (Edge Defined Film Fed Growth) method is sliced and the surface thereof is then polished.

The semiconductor film 12 includes Li, Na, K, Rb, Cs, Be, Mg, Ca, Sr, Ba, Sc, Y, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, In, Tl, C, Si, Ge, Sn, Pb, N, P, As, Sb, Bi, S, Se, Te, etc., as a dopant doped while growing crystal.

A concentration of the dopant included in the semiconductor film 12 is, e.g., not less than $1\times10^{13}$ atoms/cm$^3$ and not more than $5\times10^{20}$ atoms/cm$^3$, preferably, not less than $6.5\times10^{15}$ atoms/cm$^3$ and not more than $2.1\times10^{20}$ atoms/cm$^3$. Meanwhile, a density of carrier generated by the doping of the dopant is, e.g., not less than $1\times10^{15}$ cm$^{-3}$ and not more than $1\times10^{20}$ cm$^3$.

The semiconductor film 12 also includes Cl at a concentration of not more than $5\times10^{16}$ atoms/cm$^3$. This results from that the semiconductor film 12 is formed by the HVPE method using Cl-including gas. Generally, Cl-including gas is not used when forming a β-Ga$_2$O$_3$-based single crystal film by a method other than the HVPE method, and the (3-Ga$_2$O$_3$-based single crystal film does not include Cl, or at least does not include not less than $1\times10^{16}$ cm$^3$ of Cl.

The semiconductor film 12 is formed by the HVPE (Halide Vapor Phase Epitaxy) method with a high crystal growth rate, and thus can be formed thick, e.g., can be formed to have a thickness of not less than 1000 nm. In general, a growth rate of the β-Ga$_2$O$_3$-based single crystal film by industrial HVPE is 200 μm/h, and in this case, a film of up to 1000 μm in thickness can be formed in a realistic time. In other words, it is possible to form the semiconductor film 12 having a thickness of not less than 1000 nm and not more than 1000 μm. Meanwhile, use of the MBE method is not realistic in actual production since a crystal growth rate of the β-Ga$_2$O$_3$-based single crystal film is about 120 nm/h and it requires not less than 8 hours to form a film of not less than 1000 nm in thickness.

Meanwhile, an in-plane density of killer defects continuing from a front surface to a back surface in a thickness direction of the semiconductor film 12 can be not more than 10 defects/cm$^2$ when using a method for manufacturing the semiconductor film 12 described later. The in-plane density of killer defects included in the semiconductor film 12 can be measured by observation with an emission microscope at an anode bias of −200V.

(Structure of an HVPE Apparatus)

Next, an example structure of an HVPE apparatus used to grow the semiconductor film 12 in the first embodiment of the invention will be described.

Figure 2A:
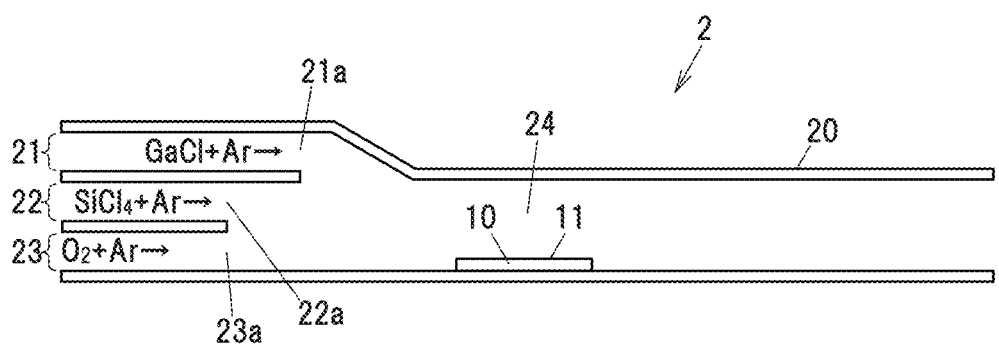
FIG. 2A is a schematic diagram illustrating a state of a placed semiconductor substrate 10 and positions of introducing source gases in the first embodiment of the invention.
Figure 2B:
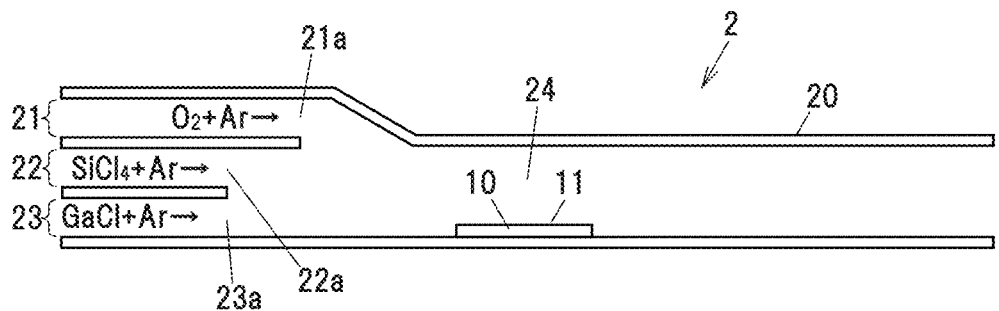
FIG. 2B is a schematic diagram illustrating a state of the placed semiconductor substrate 10 and positions of introducing the source gases in Comparative Example.

An HVPE apparatus 2 whose vertical cross section is shown in FIGS. 2A and 2B is used in the method for manufacturing a semiconductor film in the first embodiment of the invention. The HVPE apparatus 2 is a vapor phase growth apparatus for the HVPE method, and has a reaction chamber 20 having a space 24 for placement of the semiconductor substrate 10, and a first gas introducing port 21, a second gas introducing port 22 and a third gas introducing port 23 to introduce source gases for growth of the semiconductor film 12 into the space 24. The reaction chamber 20 is formed of, e.g., quartz glass.

The HVPE apparatus 2 also has a heating unit (not shown) placed around the reaction chamber 20 to heat the space 24 in the reaction chamber 20. This heating unit is, e.g., a resistive or radiation heating device.

The source gases for growth of the semiconductor film 12 are introduced into the space 24 of the reaction chamber 20 through the first gas introduction port 21, the second gas introduction port 22, and the third gas introduction port 23.

An inlet 21a of the first gas introducing port 21 to the space 24, an inlet 22a of the second gas introducing port 22 to the space 24, and an inlet 23a of the third gas introducing port 23 to the space 24 have different heights (different positions in a direction perpendicular to the growth base surface 11 of the placed semiconductor substrate 10), in such a manner that the inlet 22a is located above the inlet 23a and the inlet 21a is located above the inlet 22a. In addition, to prevent variation in condition of the semiconductor film 12 in the in-plane direction of the growth base surface 11, the positions of the inlets 21a, 22a and 23a in a horizontal direction orthogonal to the flowing direction of the source gas (positions in a direction perpendicular to the paper surface of FIGS. 2A and 2B) are substantially the same.

The source gases for growth of the semiconductor film 12 include a gallium source gas which is a Ga chloride gas such as GaCl gas, GaCl$_2$ gas, GaCl$_3$ gas or (GaCl$_3$)$_2$ gas, an oxygen source gas which is an oxygen-including gas such as O$_2$ gas or H$_2$O gas, and a dopant source gas which is a dopant-including gas such as SiCl$_4$ gas, GeCl$_4$ gas, SnCl$_4$ gas or PbCl$_2$ gas.

Each source gas is flowed into the reaction chamber 20 using an inert gas such as Ar gas or N$_2$ gas as a carrier gas.

(Method for Manufacturing a Semiconductor Film)

The method for manufacturing the semiconductor film 12 in the first embodiment of the invention includes a step of placing the semiconductor substrate 10 formed of a β-Ga$_2$O$_3$-based single crystal in the reaction chamber 20 of the HVPE apparatus 2, and a step of epitaxially growing the semiconductor film 12 formed of a β-Ga$_2$O$_3$-based single crystal on the growth base surface 11 of the semiconductor substrate 10 by flowing the Ga chloride gas, the oxygen-including gas and the dopant-including gas into the space 24 in the reaction chamber 20 where the semiconductor substrate 10 is placed.

In the first embodiment, the semiconductor substrate 10 is placed on a bottom side of the space 24 in the reaction chamber 20 so that the growth base surface 11 faces upward. Here, the growth base surface 11 facing upward means a state in which the growth base surface 11 faces a side opposite to a ground surface and an angle formed by the growth base surface 11 and a horizontal plane is in a range of −5 to +5°.

The Ga chloride gas, the oxygen-including gas and the dopant-including gas flowed in through the inlets 21a, 22a and 23a are mixed in the space 24. Then, the growth base surface 11 of the semiconductor substrate 10 is exposed to the gas mixture and the semiconductor film 12 is epitaxially grown.

In the step of epitaxially growing the semiconductor film 12, pressure in the space 24 is maintained at, e.g., 1 atm. Meanwhile, a growth temperature of not less than 900° C. is required to grow the semiconductor film 12. Single crystal may not be obtained at less than 900° C.

Here, it is preferable to use GaCl gas as the Ga chloride gas which is the gallium source gas. The temperature at which a driving force for growth of Ga$_2$O$_3$ crystal is maintained is the highest with the GaCl gas among the Ga chloride gases. Growth at a high temperature is effective to obtain a high-quality Ga$_2$O$_3$ crystal with high purity, hence, it is preferable to use a GaCl gas having a high driving force for growth at high temperature.

Meanwhile, as the dopant-including gas which is the dopant source gas, it is preferable to use a chloride-based gas to suppress unintentional inclusion of other impurities, and when, e.g., Si, Ge, Sn or Pb, which are Group 14 elements among the dopants listed above, is used as a dopant, a chloride-based gas used is respectively SiCl$_4$, GeCl$_4$, SnCl$_4$ or PbCl$_2$, etc. In addition, the chloride-based gas is not limited to those compounded with only chlorine, and, e.g., a silane-based gas such as SiHCl$_3$ may be used.

The dopant such as Si is doped while growing the β-Ga$_2$O$_3$-based single crystal.

Meanwhile, if hydrogen is included in an atmosphere during the growth of the semiconductor film 12, surface flatness of the semiconductor film 12 and a driving force for crystal growth decrease. Therefore, it is preferable that an $O_2$ gas not including hydrogen be used as the oxygen-including gas which is the oxygen source gas.

The method for manufacturing the semiconductor film 12 in the first embodiment of the invention is characterized in a positional relationship between the semiconductor substrate 10 and the respective introducing ports for the gallium source gas, the oxygen source gas and the dopant source gas in the reaction chamber 20 of the HVPE apparatus 2.

FIG. 2A is a schematic diagram illustrating a state of the placed semiconductor substrate 10 and the positions of introducing the source gases in the first embodiment of the invention. FIG. 2B is a schematic diagram illustrating a state of the placed semiconductor substrate 10 and the positions of introducing the source gases in Comparative Example.

In the first embodiment of the invention, the Ga chloride gas and a carrier gas (GaCl gas and Ar gas are shown as an example) are flowed in through the first gas introducing port 21, the dopant-including gas and a carrier gas ($SiCl_4$ gas and Ar gas are shown as an example) are flowed in through the second gas introducing port 22, and the oxygen-including gas and a carrier gas ($O_2$ gas and Ar gas are shown as an example) are flowed in through the third gas introducing port 23, as shown in FIG. 2A.

On the other hand, in Comparative Example shown in FIG. 2B, the oxygen-including gas and a carrier gas ($O_2$ gas and Ar gas are shown as an example) are flowed in through the first gas introducing port 21, the dopant-including gas and a carrier gas ($SiCl_4$ gas and Ar gas are shown as an example) are flowed in through the second gas introducing port 22, and the Ga chloride gas and a carrier gas (GaCl gas and Ar gas are shown as an example) are flowed in through the third gas introducing port 23, in the same manner as a known method for growing a β-$Ga_2O_3$-based single crystal by the HVPE method.

As a result of intense study, the present inventors found that when the positions of introducing the source gases are set to the positions shown in FIG. 2A, the number of killer defects in the growing semiconductor film 12 is reduced as compared to when setting to the positions shown in FIG. 2B. It is considered that by making the oxygen-including gas reach the growth base surface 11 most easily and the Ga chloride gas reach the growth base surface 11 least easily, the amount of Ga oxide grains formed in the vapor phase and deposited on the growth base surface 11 is reduced for some reason.

In other words, when the semiconductor substrate 10 is placed with the growth base surface 11 facing upward, the number of killer defects in the growing semiconductor film 12 is reduced by configuring such that the inlet for the dopant-including gas into the space 24 is positioned higher than the inlet for the oxygen-including gas into the space 24 and the inlet for the Ga chloride gas into the space 24 is positioned higher than the inlet for the dopant-including gas into the space 24.

Second Embodiment

The second embodiment of the invention is different from the first embodiment in the orientation of the semiconductor substrate 10 placed in the reaction chamber 20 of the HVPE apparatus 2. The description for the same features as those in the first embodiment may be omitted or simplified.

(Method for Manufacturing a Semiconductor Film)

In the method for manufacturing the semiconductor film 12 in the second embodiment of the invention, the semiconductor substrate 10 is placed on an upper side of the space 24 in the reaction chamber 20 so that the growth base surface 11 faces downward. Here, the growth base surface 11 facing downward means a state in which the growth base surface 11 faces the ground surface side and the angle formed by the growth base surface 11 and the horizontal plane is in a range of −5 to +5°.

Figure 3:
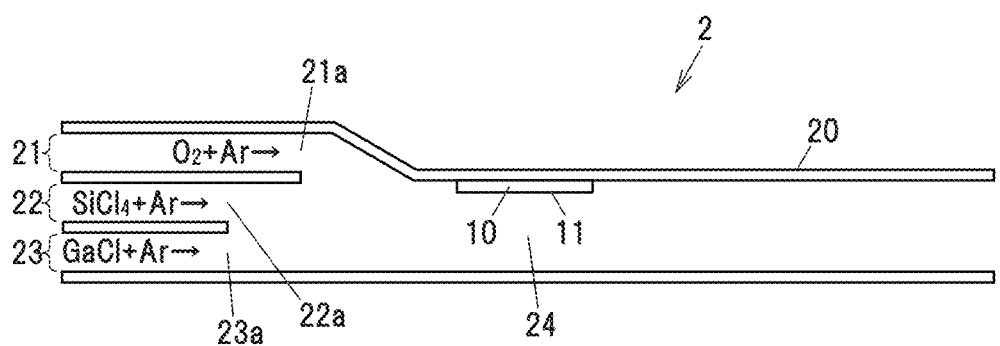
FIG. 3 is a schematic diagram illustrating a state of the placed semiconductor substrate 10 and positions of introducing the source gases in the second embodiment of the invention.

FIG. 3 is a schematic diagram illustrating a state of the placed semiconductor substrate 10 and positions of introducing the source gases in the second embodiment of the invention.

In the second embodiment of the invention, the semiconductor substrate 10 is placed with the growth base surface 11 facing downward, as shown in FIG. 3. Therefore, the oxygen-including gas and a carrier gas ($O_2$ gas and Ar gas are shown as an example) are flowed in through the first gas introducing port 21, the dopant-including gas and a carrier gas ($SiCl_4$ gas and Ar gas are shown as an example) are flowed in through the second gas introducing port 22, and the Ga chloride gas and a carrier gas (GaCl gas and Ar gas are shown as an example) are flowed in through the third gas introducing port 23.

In other words, the inlet for the dopant-including gas into the space 24 is positioned higher than the inlet for the Ga chloride gas into the space 24 and the inlet for the oxygen-including gas into the space 24 is positioned higher than the inlet for the dopant-including gas into the space 24. This makes the oxygen-including gas reach the growth base surface 11 most easily and the Ga chloride gas reach the growth base surface 11 least easily, and the number of killer defects included in the growing semiconductor film 12 is reduced.

Furthermore, since the grains of Ga oxide formed in the vapor phase move downward due to gravity, the grains of Ga oxide become further less likely to be deposited on the growth base surface 11 by placing the semiconductor substrate 10 with the growth base surface 11 facing downward. Therefore, the number of killer defects included in the semiconductor film 12 can be reduced more in the method for manufacturing a semiconductor film in the second embodiment than in the method for manufacturing a semiconductor film the first embodiment.

Meanwhile, when growing GaN-based crystal films by the HVPE method, formation of grains of GaN-based compound in the vapor phase hardly occur since the reaction rate of ammonia gas with Ga chloride gas is relatively slow, as mentioned above. Therefore, when growing GaN-based crystal films, generation of many killer defects as in the case of growing β-$Ga_2O_3$-based crystal films does not occur, and in addition, placing the substrate with the growth base surface facing downward has substantially no effect on reducing killer defects. A technique for growing a GaN-based crystal film by the HVPE method in a state in which the growth base surface of the substrate faces downward is known (Japanese Patent No. 3376809), but the purpose for this is to grow a uniform thin film by suppressing thermal convection of source gases around the substrate.

It has also been confirmed that the dopant incorporation rate is higher when placing the semiconductor substrate 10 with the growth base surface 11 facing downward than when placing the semiconductor substrate 10 with the growth base surface 11 facing upward. Since the donor concentration in the semiconductor film 12 becomes substantially the same as the charging amount of the dopant by placing the semiconductor substrate 10 with the growth base surface 11 facing downward, it is easy to control the donor concentration.

In addition, when increasing the flow velocity of the Ga chloride gas, the oxygen-including gas and the dopant-including gas, the grains of Ga oxide formed in the vapor phase are easily swept away by these source gases and the amount of Ga oxide grains deposited on the growth base surface 11 can be thereby reduced.

When growing the semiconductor film 12 on, e.g., a 2-inch diameter circular semiconductor substrate 10, the number of killer defects included in the semiconductor film 12 can be significantly reduced by flowing the Ga chloride gas, the oxygen-including gas and the dopant-including gas into the space 24 at a flow velocity of not less than 110 cm/s, and can be further reduced by flowing the gases into the space 24 at a flow velocity of not less than 165 cm/s.

Effects of the Embodiments

According to the embodiments described above, it is possible to reduce the amount of the Ga oxide grains formed in the vapor phase and deposited on the semiconductor substrate 10 in the reaction chamber of the HVPE apparatus and reduce killer defects in the semiconductor film 12 formed of a β-$Ga_2O_3$-based single crystal. By using this semiconductor film 12 with few killer defects, semiconductor devices with excellent characteristics, e.g., Schottky barrier diodes with excellent forward current and reverse leakage current characteristics, can be produced with high yield.

Examples

Figure 4A:
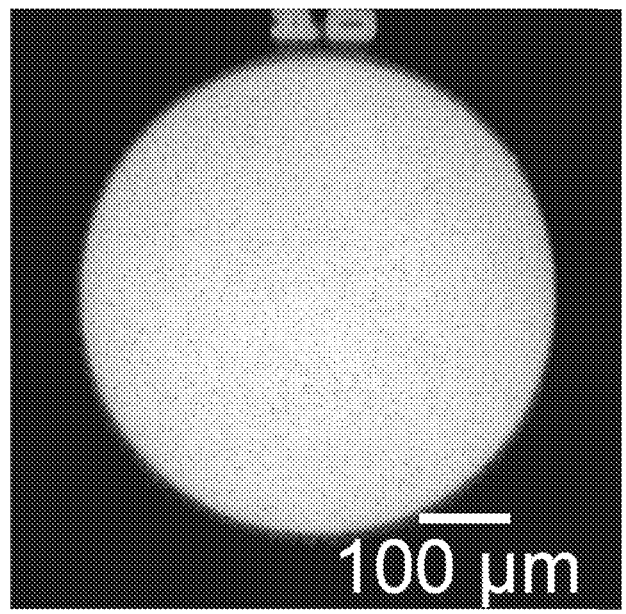
FIG. 4A is an emission microscope observation image showing a semiconductor film formed by a method according to the second embodiment.
Figure 4B:
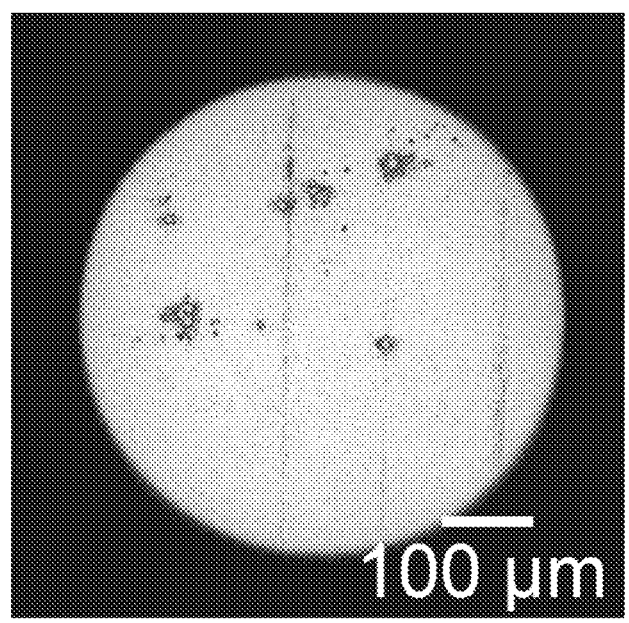
FIG. 4B is an emission microscope observation image showing a semiconductor film as Comparative Example formed by a known method.

FIG. 4A is an emission microscope observation image showing the semiconductor film 12 formed by the method according to the second embodiment described in reference to FIG. 3. FIG. 4B is an emission microscope observation image showing the semiconductor film as Comparative Example formed by the known method described in reference to FIG. 2B.

As for the emission microscope observation images in FIGS. 4A and 4B, an anode electrode and a cathode electrode were respectively formed on the surface of the semiconductor film 12 and a surface of the semiconductor substrate 10 so as not to overlap each other, a region in which the anode electrode is formed was photographed by a CCD camera from the semiconductor substrate 10 side, and a pattern image of the 500 µm-diameter circular anode electrode photographed by irradiation with light in a state in which no voltage is applied between the two electrodes was superimposed onto an emission image photographed in a state in which a reverse voltage of 200V (positive voltage on the cathode electrode side and negative voltage on the anode electrode side) was applied between the two electrodes.

Black dots seen in the circle of FIG. 4B are leakage paths illuminated due to reverse voltage application, and show locations of killer defects to be leakage paths. In the emission microscope observation image in FIG. 4A, luminous spots which are as noticeable as those in the emission microscope observation image in FIG. 4B are not observed and the density of the luminous spots estimated using plural anode electrodes was not more than 10 spots/$cm^2$. In other words, a density of killer defects in the semiconductor film 12 in the second embodiment was not more than 10 defects/$cm^2$.

Figure 5A:
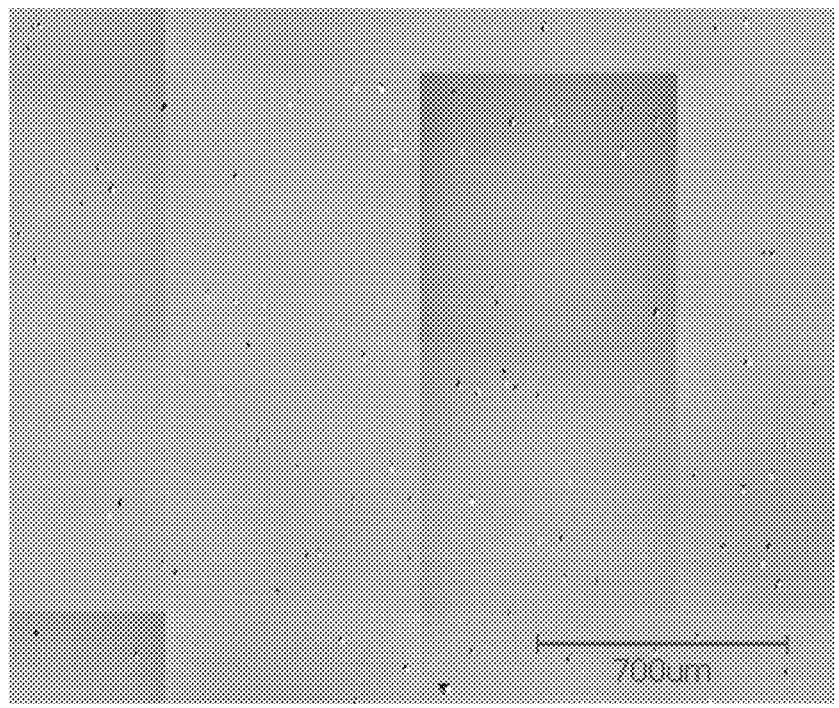
FIG. 5A is an optical microscope observation image showing a surface of a semiconductor film formed by the method according to the second embodiment on which etch pits appeared.
Figure 5B:
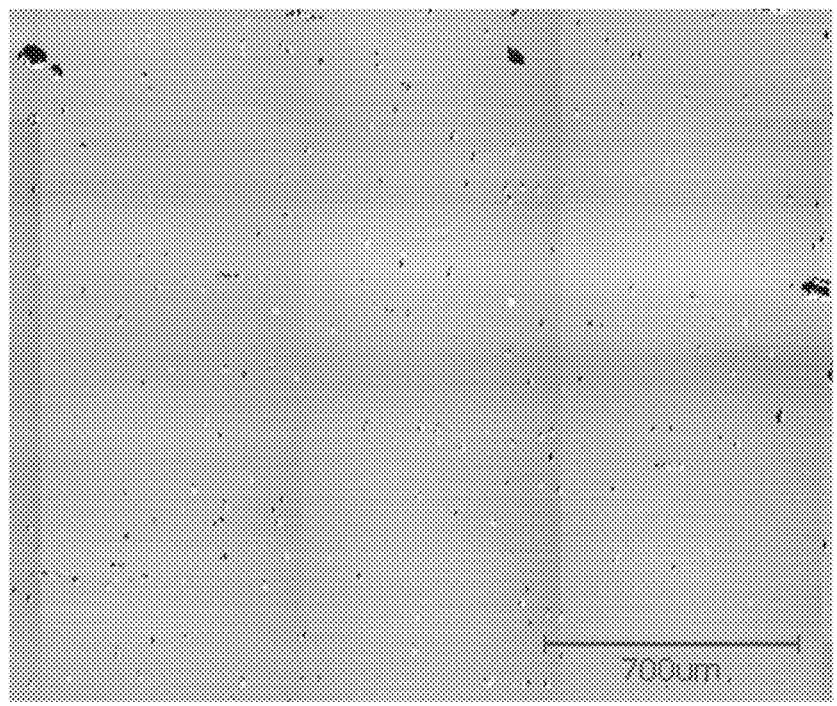
FIG. 5B is an optical microscope observation image showing a surface of a semiconductor film as Comparative Example formed by the known method on which etch pits appeared.

FIG. 5A is an optical microscope observation image showing a surface of the semiconductor film 12 formed by the method according to the second embodiment described in reference to FIG. 3, on which etch pits appeared. FIG. 5B is an optical microscope observation image showing a surface of the semiconductor film as Comparative Example formed by the known method described in reference to FIG. 2B, on which etch pits appeared.

Etch pits are depressions formed due to an etching rate difference between defective portions and other portions during etching a crystal surface, and the locations and density of defects can be determined by observing the etch pits. The etch pits in FIGS. 5A and 5B were formed by immersing the semiconductor film 12 grown on the semiconductor substrate 10 in hot phosphoric acid for 1 hour.

Figure 6:
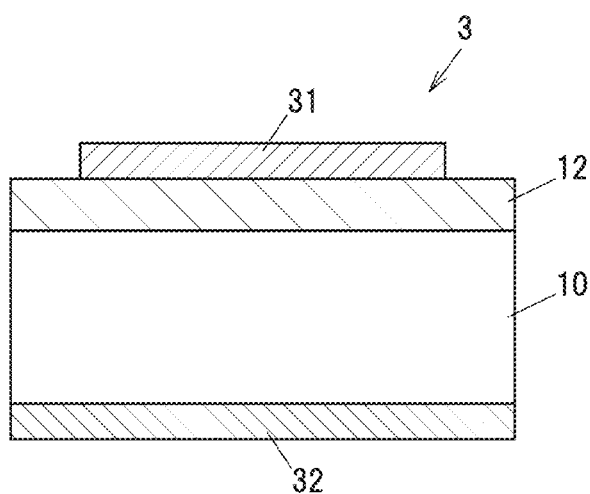
FIG. 6 is a vertical cross-sectional view showing a Schottky barrier diode used to evaluate Schottky barrier diode characteristics described later.

In the observation image in FIG. 5B, the etch pit density of the semiconductor film in Comparative Example was about 10000/$cm^2$. On the other hand, in the observation image in FIG. 5A, the etch pit density of the semiconductor film 12 was about 2500/$cm^2$ which is about ¼ of the etch pit density of the semiconductor film in Comparative Example FIG. 6 is a vertical cross-sectional view showing a Schottky barrier diode 3 used to evaluate Schottky barrier diode characteristics described later.

The Schottky barrier diode 3 has the semiconductor substrate 10 formed of a β-$Ga_2O_3$ single crystal and having an effective carrier concentration (a value obtained by subtracting an acceptor concentration $N_a$ from a donor concentration $N_d$) of about $1\times10^{18}$/$cm^3$ and a thickness of about 600 µm, the semiconductor film 12 formed of a β-$Ga_2O_3$ single crystal and having an effective carrier concentration of about $1\times10^{16}$/$cm^3$ and a thickness of about 6 µm, an anode electrode 31 having a Ni/Au laminated structure formed on a surface of the semiconductor film 12, and a cathode electrode 32 having a Ti/Ni/Au laminated structure formed on the entire surface of the semiconductor substrate 10.

Figure 7A:
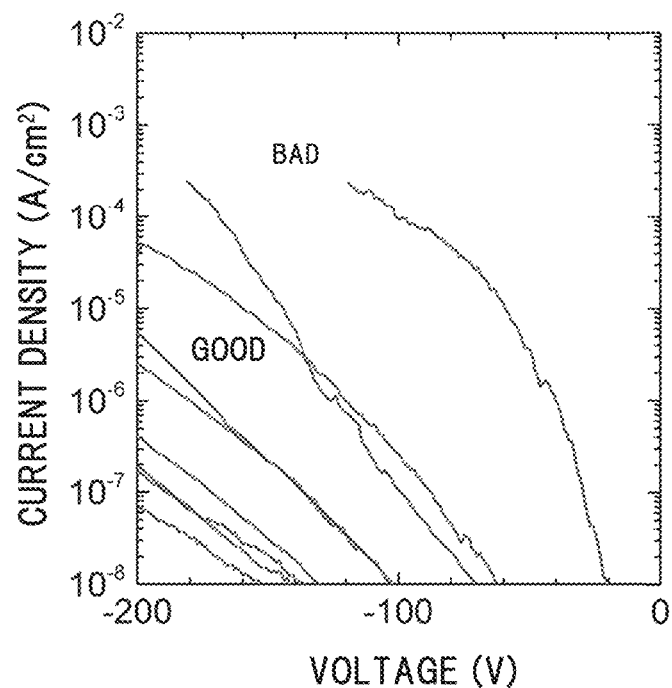
FIG. 7A is a graph showing reverse leakage characteristics of a Schottky barrier diode which includes a semiconductor film formed by a method according to the first embodiment.
Figure 7B:
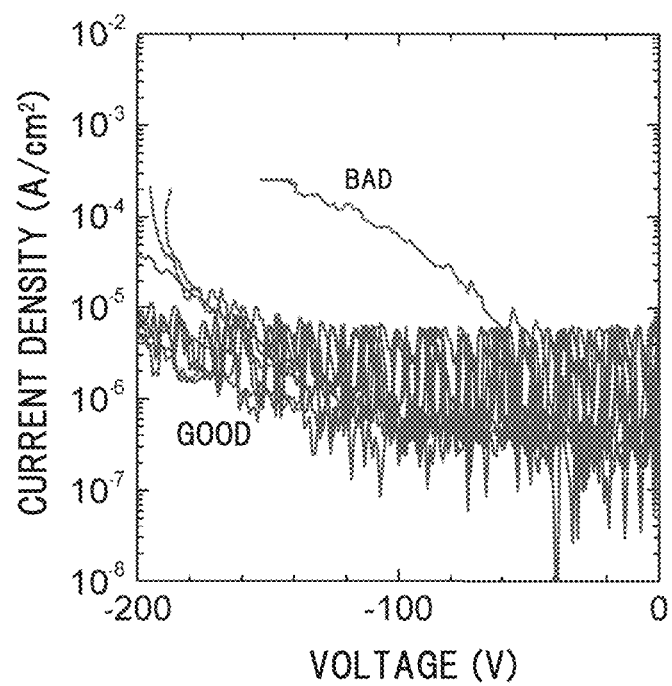
FIG. 7B is a graph showing reverse leakage characteristics of a Schottky barrier diode which includes a semiconductor film formed by the method according to the second embodiment.
Figure 8:
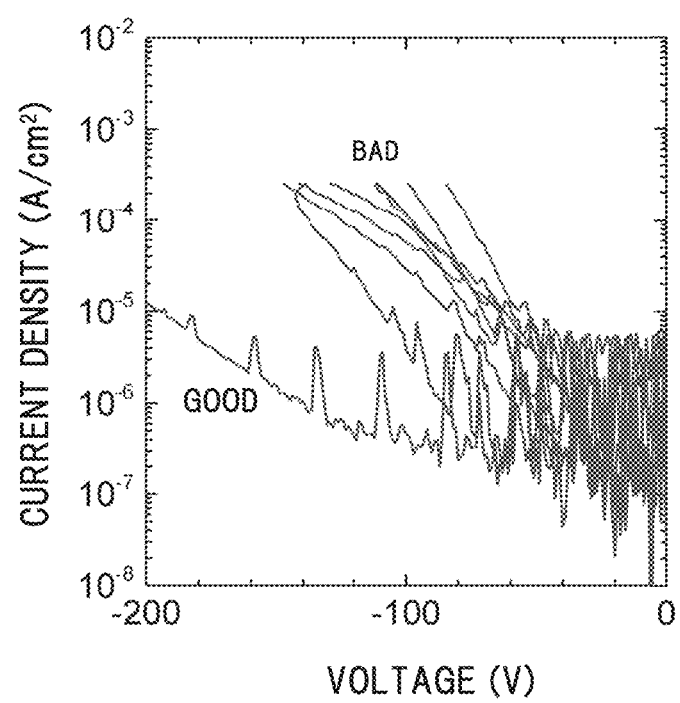
FIG. 8 is a graph showing reverse leakage characteristics of a Schottky barrier diode which includes a semiconductor film as Comparative Example formed by the known method.

FIG. 7A is a graph showing reverse leakage characteristics of the Schottky barrier diode 3 which includes the semiconductor film 12 formed by the method according to the first embodiment described in reference to FIG. 2A. FIG. 7B is a graph showing reverse leakage characteristics of the Schottky barrier diode 3 which includes the semiconductor film 12 formed by the method according to the second embodiment described in reference to FIG. 3. FIG. 8 is a graph showing reverse leakage characteristics of the Schottky barrier diode 3 in which a semiconductor film as Comparative Example formed by the known method described in reference to FIG. 2B is provided in place of the semiconductor film 12.

The anode electrodes 31 of the Schottky barrier diodes 3 of FIGS. 7A, 7B and 8 are circular electrodes with a diameter of 500 µm.

In FIGS. 7A, 7B and 8, a leakage current of not more than $1\times10^{-4}$ A/$cm^2$ when applying a voltage of −200 V to the anode electrode is indicated as "Good" and more than $1\times10^{-4}$ A/$cm^2$ is indicated as "Bad".

When the percentage of "Good" out of the total is defined as the yield, the yield of the Schottky barrier diode 3 with the semiconductor film 12 formed by the method according to the first embodiment described in reference to FIG. 2A was 78%, the yield of the Schottky barrier diode 3 with the semiconductor film 12 formed by the method according to the second embodiment described in reference to FIG. 3 was 89%, and the yield of the Schottky barrier diode 3 with the semiconductor film as Comparative Example formed by the known method described in reference to FIG. 2B was 11%.

Figure 9A:
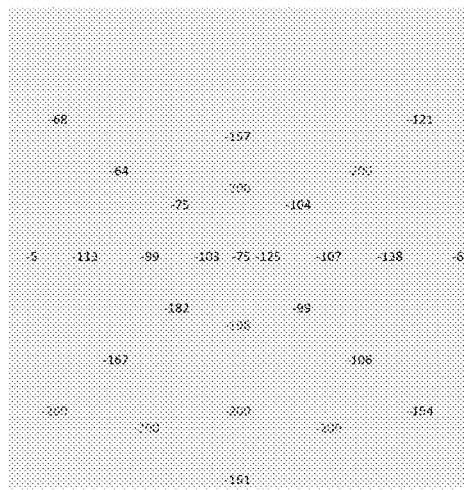
FIG. 9A is a diagram illustrating distribution of breakdown voltage characteristics of Schottky barrier diodes on a 2-inch wafer before dicing into individual Schottky barrier diodes provided with a semiconductor film formed by the method according to the second embodiment.
Figure 9B:
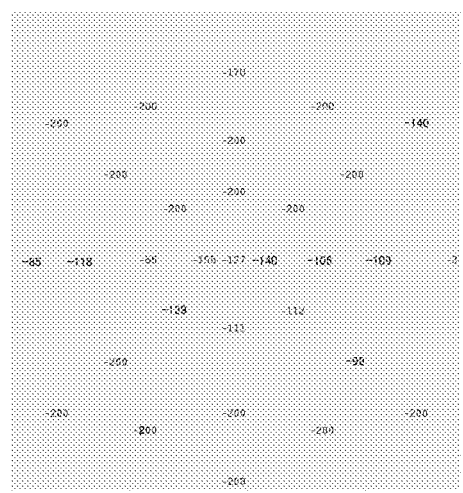
FIG. 9B is a diagram illustrating distribution of breakdown voltage characteristics of Schottky barrier diodes on a 2-inch wafer before dicing into individual Schottky barrier diodes provided with a semiconductor film formed by the method according to the second embodiment.
Figure 9C:
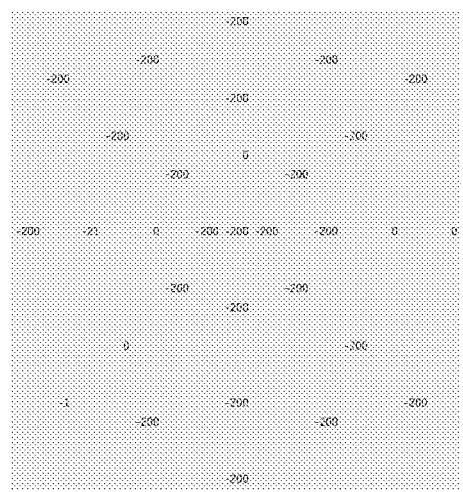
FIG. 9C is a diagram illustrating distribution of breakdown voltage characteristics of Schottky barrier diodes on a 2-inch wafer before dicing into individual Schottky barrier diodes provided with a semiconductor film formed by the method according to the second embodiment.

FIGS. 9A to 9C are diagrams illustrating distribution of breakdown voltage characteristics of Schottky barrier diodes on a 2-inch wafer (the crystal laminated structure 1 with plural anode electrodes 31 and the cathode electrode 32) before dicing into individual Schottky barrier diodes 3 provided with the semiconductor film 12 formed by the method according to the second embodiment described in reference to FIG. 3.

FIGS. 9A to 9C are diagrams when viewing the semiconductor film 12 from vertically above, and the numbers shown indicate breakdown voltage (voltage when a leakage current of 1 μA flows) of the Schottky barrier diodes 3 at the locations of the numbers, with negative values indicating reverse voltage. Meanwhile, since the measurement limit of the breakdown voltage is −200V, breakdown voltage of the Schottky barrier diodes 3 at locations indicated by "−200" in the drawings is not more than −200V. The Schottky barrier diodes 3 at the locations indicated by "−200" in the drawings can be judged to have sufficient breakdown voltage.

The semiconductor film 12 of FIG. 9A was grown by flowing the source gases (the Ga chloride gas, the oxygen-including gas and the dopant-including gas) into the space 24 at a flow velocity of 55 cm/s, the semiconductor film 12 of FIG. 9B was grown by flowing the source gases into the space 24 at a flow velocity of 110 cm/s, and the semiconductor film 12 of FIG. 9C was grown by flowing the source gases into the space 24 at a flow velocity of 165 cm/s. The direction of the arrow in the drawings indicates a direction in which the source gases flow.

FIGS. 9A to 9C show that a region of the wafer, from which Schottky barrier diodes 3 with excellent breakdown voltage can be obtained, is larger when the flow velocity of the source gases is faster. It is considered that this is because the faster the flow velocity of the source gases, the easier it is to sweep away the grains of Ga oxide formed in the vapor phase, hence, the amount of Ga oxide grains deposited on the growth base surface 11 is reduced and killer defects in the semiconductor film 12 are reduced.

In addition, it is understood from FIGS. 9A to 9C that when the diameter of the wafer is 2 inches, the number of killer defects included in the semiconductor film 12 can be significantly reduced by flowing the source gases into the space 24 at a flow velocity of not less than 110 cm/s, and can be further reduced by flowing the gases into the space 24 at a flow velocity of not less than 165 cm/s.

However, the faster the flow velocity of the source gases, the more the amount of the source gases that flows away without contributing to the growth of the semiconductor film 12, hence, efficiency of source gas usage decreases and consequently the manufacturing cost of the semiconductor film 12 increases. Therefore, it is preferable that the flow velocity just enough to obtain the Schottky barrier diodes 3 with excellent breakdown voltage from the whole region of the wafer be set as the upper limit.

In addition, when increasing the size of the wafer from which the Schottky barrier diodes 3 are cut out, the flow velocity of the source gases can be further increased to ensure that a region from which the Schottky barrier diode 3 with excellent breakdown voltage can be obtained is wide. When forming, e.g., a 4-inch diameter wafer, the flow velocity of the source gases should be twice as fast as when forming a 2-inch diameter wafer, and the number of killer defects included in the semiconductor film 12 can be significantly reduced by flowing the source gases into the space 24 at a flow velocity of not less than 220 cm/s, and can be further reduced by flowing the gases into the space 24 at a flow velocity of not less than 330 cm/s.

Figure 10A:
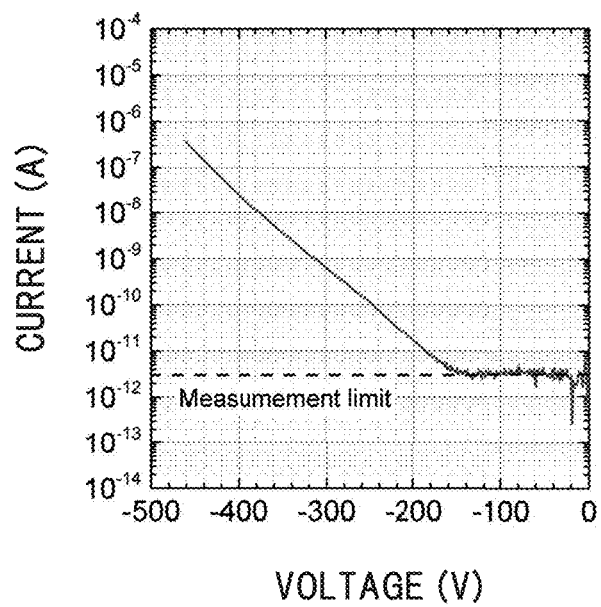
FIG. 10A is a graph showing reverse characteristics of a Schottky barrier diode which includes a semiconductor film formed by the method according to the second embodiment and a 2.3-mm square anode electrode.
Figure 10B:
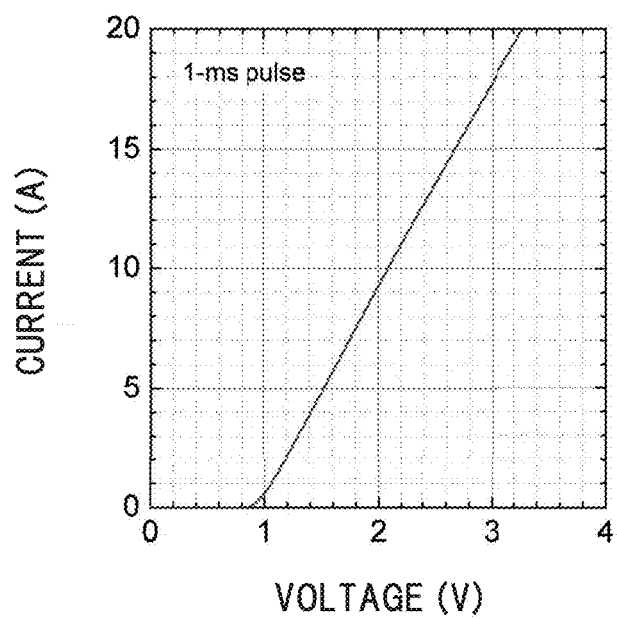
FIG. 10B is a graph showing forward characteristics of the Schottky barrier diode which includes the semiconductor film formed by the method according to the second embodiment and the 2.3-mm square anode electrode.

FIGS. 10A and 10B are graphs respectively showing reverse characteristics and forward characteristics of the Schottky barrier diode 3 which includes the semiconductor film 12 formed by the method according to the second embodiment described in reference to FIG. 3 and the 2.3-mm square anode electrode 31. A dotted line in FIG. 10A indicates the measurement limit. The forward characteristics shown in FIG. 10B were measured by applying a pulse voltage with a pulse width of 1 ms.

In FIG. 10A, the magnitude of the leakage current is less than 1 μA even when the applied voltage is −460 V, which indicates that excellent reverse leakage characteristics are obtained. Meanwhile, in FIG. 10B, a current of not less than 10A flows when the applied voltage is not less than 2.1V, which indicates that excellent high-current characteristics are obtained.

Although the embodiments and Examples of the invention have been described, the invention is not intended to be limited to the embodiments and Examples, and the various kinds of modifications can be implemented without departing from the gist of the invention. In addition, the constituent elements in the embodiments and Examples can be arbitrarily combined without departing from the gist of the invention.

In addition, the invention according to claims is not to be limited to the embodiments and Examples described above. Further, it should be noted that not all combinations of the features described in the embodiments and Examples are necessary to solve the problem of the invention.

INDUSTRIAL APPLICABILITY

The invention provides a semiconductor film formed of a β-Ga$_2$O$_3$-based single crystal and including few killer defects, and a method for manufacturing the semiconductor film.

REFERENCE SIGNS LIST

1 CRYSTAL LAMINATED STRUCTURE
2 HVPE APPARATUS
3 SCHOTTKY BARRIER DIODE
10 SEMICONDUCTOR SUBSTRATE
11 GROWTH BASE SURFACE
12 SEMICONDUCTOR FILM
20 REACTION CHAMBER
21 FIRST GAS INTRODUCING PORT
22 SECOND GAS INTRODUCING PORT
23 THIRD GAS INTRODUCING PORT
24 SPACE
31 ANODE ELECTRODE
32 CATHODE ELECTRODE

The invention claimed is:

1. A method for manufacturing a semiconductor film, comprising:
  placing a semiconductor substrate comprising a β-Ga$_2$O$_3$-based single crystal in a reaction chamber of an HVPE apparatus so that a growth base surface of the semiconductor substrate faces upward or downward; and
  epitaxially growing a semiconductor film comprising a β-Ga$_2$O$_3$-based single crystal on the growth base surface of the semiconductor substrate by flowing a Ga chloride gas, an oxygen-including gas and a dopant-including gas into a space in the reaction chamber where the semiconductor substrate is placed,
  wherein in the placing the semiconductor substrate, the semiconductor substrate is placed in the reaction chamber so that the growth base surface faces downward, the inlet for the dopant-including gas into the space is positioned higher than the inlet for the Ga chloride gas into the space and the inlet for the oxygen-including gas into the space is positioned higher than the inlet for the dopant-including gas into the space.

2. The method for manufacturing a semiconductor film according to claim 1, wherein the Ga chloride gas comprises a GaCl gas, wherein the oxygen-including gas comprises an $O_2$ gas, and wherein the dopant-including gas comprises a $SiCl_4$ gas.

3. The method for manufacturing a semiconductor film according to claim 1, wherein in the epitaxially growing the semiconductor film, the Ga chloride gas, the oxygen-including gas and the dopant-including gas are flowed into the space at a flow velocity of not less than 110 cm/s.

* * * * *